United States Patent [19]
Monnet

[11] Patent Number: 4,626,185
[45] Date of Patent: Dec. 2, 1986

[54] METHOD AND APPARATUS FOR MOLDING A FRAME AROUND THE PERIPHERY OF A FLAT OR CURVED OBJECT

[75] Inventor: Bernard Monnet, Bellignat, France

[73] Assignee: Billion S.A., Bellignat, France

[21] Appl. No.: 775,862

[22] Filed: Sep. 13, 1985

[30] Foreign Application Priority Data

Sep. 21, 1984 [FR] France ............... 84 14649

[51] Int. Cl.⁴ .................................... B29D 27/00
[52] U.S. Cl. .................................... 425/110; 425/116; 425/117; 425/121; 425/129 R; 425/405 R; 425/DIG. 14; 249/65; 249/83; 264/252; 264/271.1; 264/279.1; 264/314
[58] Field of Search ............... 425/110, 116, 117, 121, 425/129 R, 405 R, DIG. 14; 249/65, 83; 264/314, 252, 271.1, 279.1

[56] References Cited

U.S. PATENT DOCUMENTS

| 4,000,877 | 1/1977 | Shead et al. | 249/82 |
| 4,060,218 | 11/1977 | Nayagam | 249/65 |
| 4,145,171 | 3/1979 | Guzowski | 425/110 |
| 4,247,274 | 1/1981 | Gustafson et al. | 425/193 |
| 4,266,925 | 5/1981 | Book | 425/387.1 |
| 4,284,673 | 8/1981 | Ockels | 428/54 |
| 4,381,908 | 5/1983 | Roth | 425/129 R |
| 4,470,784 | 9/1984 | Piotrousky | 425/116 |
| 4,470,785 | 9/1984 | Koorevaar | 425/116 |
| 4,544,126 | 10/1985 | Melchert | 249/83 |

Primary Examiner—John E. Kittle
Assistant Examiner—Patrick Ryan
Attorney, Agent, or Firm—Sughrue, Mion, Zinn, Macpeak, and Seas

[57] ABSTRACT

A generally planar object 22 subject to dimensional variations is centrally held in a mold by a deformable suction ring 20, and inflatable seals 8, 9 are urged against its opposite peripheral surfaces to define a cavity 17 for the injection molding of a precisely dimensioned edge frame 23. The dimensions of the rigid mold halves 2, 3 and the elasticity of the ring and seals are such that a wide range of dimensional variations may be tolerated in the object, which may be a curved automobile glass panel, a printed circuit board, etc.

6 Claims, 7 Drawing Figures

U.S. Patent   Dec. 2, 1986   Sheet 1 of 2   4,626,185
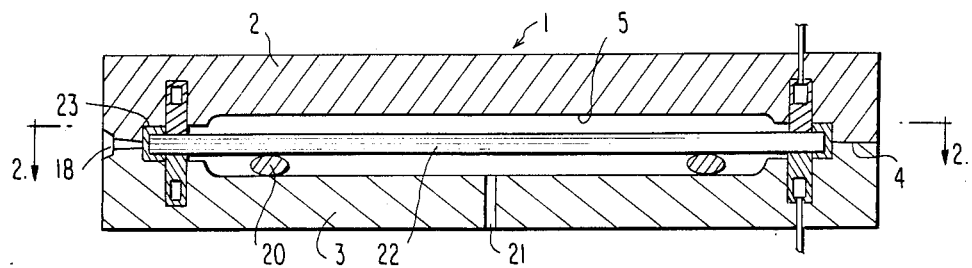
FIG.1
FIG.2
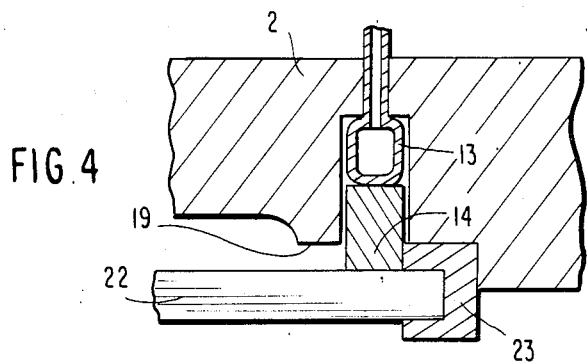
FIG.4

METHOD AND APPARATUS FOR MOLDING A FRAME AROUND THE PERIPHERY OF A FLAT OR CURVED OBJECT

BACKGROUND OF THE INVENTION

This invention relates to a method and apparatus for the duplicate injection molding of a precisely dimensioned frame around the periphery of a flat or curved object, the measurements of which are subject to dimensional variations or tolerances. Such a duplicate molded frame makes it possible to achieve the specified measurements for the overall perimeter and for the thickness of the assembled object and frame.

More particularly, but not exclusively, the invention concerns the body panels of automobiles, such as the glass panels for the front and rear windshields, or other glass panels for vehicles or buildings that are to be set into an opening in a wall or other surface, where the dimensions of the opening are exact.

It is well known that mass produced parts show considerable dimensional variation from one to the other, and from specifications. These variations are due either to the process of manufacture used, particularly if no machining is involved, to drift over time in the adjustment parameters of the tools used, and/or to wear in these tools. When these parts must be assembled into a whole with other parts, there are difficulties in obtaining a proper assembly as a result of the dimensional variations between the specifications and the real measurements of the parts being assembled.

This poses the problem of carrying out such assemblies, even using parts or panels with dimensions that are smaller than the dimensions into which they are to be set.

SUMMARY OF THE INVENTION

The invention solves this problem by providing a method and apparatus for the duplicate molding of a frame of precise dimensions onto the periphery of a flat or curved object subject to dimensional tolerances. According to the invention, an object is precisely positioned in a mold, leaving within the mold a closed clearance around its periphery defining a circumferential mold cavity, and a closed central space for retaining the object by suction. The object is made fast within the mold on a flexible support ring by depressurizing the central space, and its periphery is flexibly pinched between opposing inflatable seals through the action of a pressurized fluid. A plastic or elastomeric material in the form of a liquid or paste is injected into the closed circumferential space that forms the mold cavity of the desired frame, and after solidification the seals are depressurized to release the object and the central space is vented. The mold is then opened and the framed object is extracted.

BRIEF DESCRIPTION OF THE DRAWINGS

FIG. 1 is a transverse cross-section of an injection mold according to the invention, FIG. 2 is a cross-section of the mold taken along line 2-2 of FIG. 1, FIG. 4 is a partial transverse cross-section, enlarged in scale, of a variant of the mold shown in FIG. 1, FIGS. 5 and 6 are partial transverse cross-sections of variant frames molded in accordance with the invention.

DETAILED DESCRIPTION OF THE PREFERRED EMBODIMENTS

Figure 3:
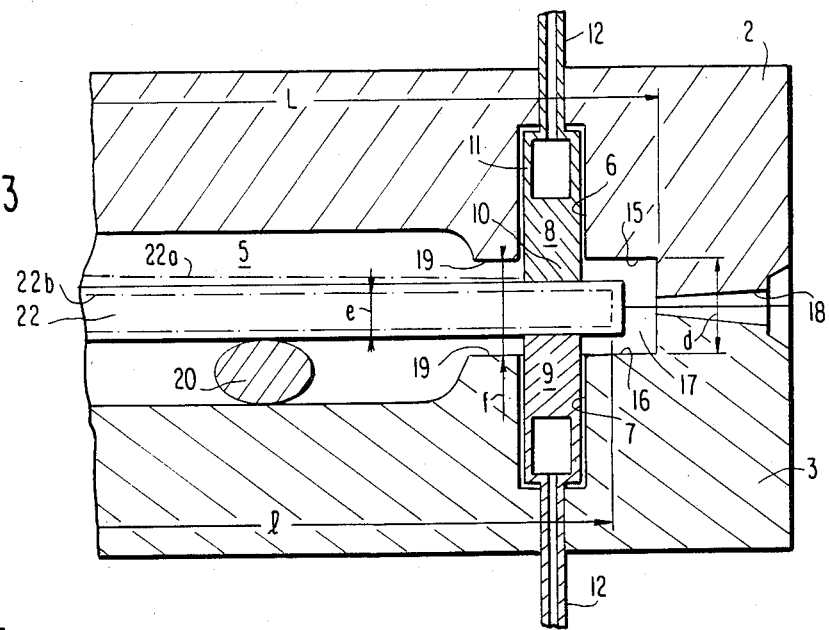
FIG. 3 is a partial transverse cross-section, enlarged in scale, of the mold shown in FIG. 1.

According to the embodiment of FIGS. 1, 2, and 3, the invention is applied to a non-machined plate or object 22 whose dimensions are subject to certain variations or tolerances. The mold of the invention essentially comprises an injection mold 1 consisting of two half-molds 2 and 3 which, when pressed together along interface plane 4, define a central chamber 5. In the peripheral areas of half-molds 2 and 3, and on either side of plane 4, there are transversal channels 6 and 7, rectangular in cross-section and oriented perpendicular to plane 4. They are symmetrical with respect to the plane and thus face each other when the two half-molds are assembled.

Flexible and sliding expansible seals 8 and 9, made of plastic or an elastomer, are housed in channels 6 and 7, which serve to guide them. They are able to move toward each other and extend beyond channels 6 and 7 under the force of a pressurized fluid. These seals, as shown in FIG. 3, consist of a solid portion 10 and a ductile hollow portion 11 that abuts the bottom of channels 6 and 7. The hollow portion 11 of each seal is filled with a fluid, and connected by a tube 12 to means (not shown) for pressurizing and draining the fluid. The seals may also consist of the combination of a ductile shell 13 disposed in the bottom of each channel, and an independent solid piece 14, as shown in FIG. 4. Shell 13 is filled with a fluid and connected to pressurizing means. The solid portions 10 and 14 of seals 8 and 9 protrude beyond channels 6 and 7 when the hollow portions are pressurized by the fluid.

Within the peripheral parts of each half-mold 2 and 3 and lying between the channels 6 and 7 and the ends of the halfmolds, opposing hollow recesses 15 and 16 are provided. When the half-molds are assembled, these recesses form a peripheral chamber or mold cavity 17 connected through one or more injection ports 18 to pressurized injection means (not shown).

Opposing shoulders 19 provided in both half-molds 2 and 3 separate the central chamber 5 from the channels 6 and 7. Their function is to provide lateral support on the side of central chamber 5 for the solid parts 10 or 14 of seals 8 and 9, which protrude from the channels under the force of fluid pressure in hollow portions 11 or 13, when material is injected under pressure into peripheral mold cavity 17. The distance f (exact theoretical measurement) separating the two opposing shoulders 19 is determined by the maximum variation of thickness or edge curvature of an object 22 inserted into the mold 1. In practice, therefore, this measurement is considerably higher than the real measurement e of an object 22.

Lastly, a generally toroidal suction seal ring 20 is placed in one of the half-molds, e.g., 3, surrounding an opening 21 in the mold wall. The opening 21 is connected to depressurizing or suction means (not shown).

Thus, a mold cavity is provided in the closed clearance surrounding the peripheral edge of the object 22, and a closed unilateral space is provided within the ring 20 for holding object 22 fast using suction.

In operation, object 22 with measurements that are less than the specifications, particularly in measurements L and d, is inserted by a robot (not shown) onto suction ring 20 of half-mold 3 in a predetermined position. The suction cavity formed by the lower surface of object 22 and ring 20 is then depressurized through opening 21, which pulls object 22 against ring 20 and hold it firmly in position. Mold 1 is then closed by the upper half-mold 2, and the two mold halves are firmly clamped together by conventional means (not shown).

Next, ductile portions 11 of seals 8 and 9, or the ductile shells 13 of the alternate seals, are pressurized through tubes 12, which causes solid portions 10 or 14 of seals 8 and 9 to emerge from channels 6 and 7 and to be firmly applied against the opposing surfaces of object 22, which is then squeezed between the solid portions of these seals. The pressure applied to seals and 9 is determined such that the solid portions of the seals will exert equal and opposite pressure on both surfaces of object 2. As a result, the positioning and fastening of object 22 in mold 1 is reinforced by the action of expansible seals 8 and 9, circumferential mold cavity 17 enclosing the edges of object 22 is hermetically sealed, and inserted object 22 is not deformed since the force exerted by the solid parts 10 or 14 of the seals is equal and opposite.

A thermosetting or thermoplastic plastic material, or an elastomer, in liquid or paste form, is then injected under pressure into the circumferential mold cavity 17 through ports 18, thus forming a frame 23 having a precise size and shape around the periphery of object 22.

After the injected material has hardened the pressure is reduced on seals 8 and 9, and the suction holding object 22 against ring 20 is relieved by venting opening 21 to the atmosphere. The mold is then opened and object 22, equipped with its molded frame 23, is extracted.

The invention is applicable to molding edge frames around objects or panels 22, such as building glass, automobile glass, printed circuits, and metal panels.

The duplicate injection molding of a frame 23 around an object 22 makes it possible to produce a series of framed objects whose exact exterior dimensions L and d will always be the same, even though objects 22 are themselves characterized by dimensional variations, with their real measurements varying between e and f in thickness and l and L in length (see silhouette 22b in broken lines in FIG. 3).

The duplicate molding may be performed on flat or curved objects (silhouette 22a in broken lines in FIG. 3) since the flexible, expansible, and ductile seals 8 and 9 delimit circumferential mold chamber 17 and since the suction ring 20 is elastic. These advantages are obtained by virtue of the clearance provided by central chamber 5 and by cavities 15-16 of mold 1 around object 22, and by virtue of the elasticity of the means for positioning, supporting, and pinching the object.

Frame 23 may be molded with fastening means for assembling the resulting objects together with other units, e.g., by snapping them together to form assemblies.

Figure 5:
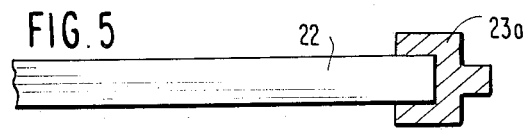
Figure 6:
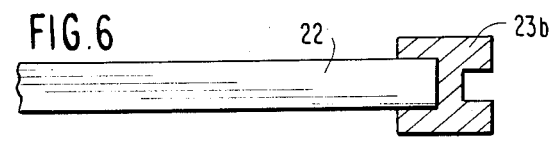

It is also possible within duplicate molded frame 23 to form male (23a) or female (23b) tracks such as those shown in FIGS. 5 and 6.

Finally, the frame 23 may define or embody a well fitted seal around the object 22. In this case the substance injected would be an elastomer.

Figure 7:
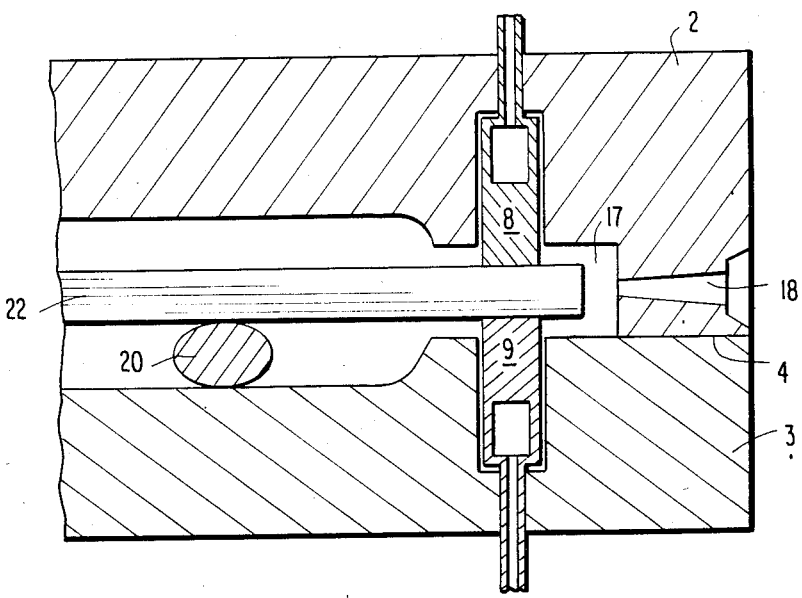
FIG. 7 is a partial transverse cross-section, enlarged in scale, of a further variant of the mold shown in FIG. 1.

A further variant is shown in FIG. 7, in which the circumferential mold cavity 17 is provided entirely by one of the half-molds, e.g., 2, with the other serving primarily to close the cavity.

What is claimed is:

1. An apparatus for the injection molding of a precisely dimensioned frame (23) onto and around the circumference of a generally planar object (22) having a substantially fixed area but being subject to variations in circumferential dimensions, comprising:
    (a) a pair of mold halves (2, 3), each having an exterior and an interior surface, the interior surface of each mold half being contoured and comprising a central recessed portion (5) having an area less than said object area, a shoulder portion (19) surrounding said recessed portion and an interface portion (4) surrounding said shoulder portin, said interface portion and said shoulder portion defining a precisely dimensioned cavity portion (17), said mold halves being adapted to be secured together in contact at said interface portion with said object disposed therebetween, whereby said shoulder portions on each mold half are opposite one another, and said cavity portions define the precisely dimensioned outer surfaces of an edge frame mold surrounding the outer circumference of said object;
    (b) first sealing means (20) disposed in the recess portion of one of the mold halves and adapted to contact said object for defining, together with the object and said one mold half, a suction chamber for retaining the object in a predetermined position;
    (c) second sealing means (8, 9) disposed in said shoulder portion of each mold half and being individually and cooperably operable, when said mold halves are secured with said object therebetween, to engage the opposite surfaces of the object proximate and inwardly from an outer edge thereof to complete and seal the edge frame mold, and
    (d) means (18) for injecting a plastic or elastomeric material into the edge frame mold cavity under pressure.

2. An apparatus according to claim 1, wherein the second sealing means comprises a pair of closed figure, expansible and flexible seals disposed facing each other and perpendicular to an interface plane (4) between the two mold halves, said seals being individually housed in opposing channels (6, 7) in the mold halves and protruding from said channels to pinch the object between them.

3. An apparatus according to claim 2, wherein the expansible seals each comprise a solid portion (10) and a ductile, expansible hollow portion (11) abutting the bottom of a channel.

4. An apparatus according to claim 2, wherein the expansible seals each comprise the combination of a ductile, expansible shell (13) resting in the bottom of a channel, and an independent solid portion (14) extendible outwardly from the channel.

5. An apparatus according to claim 2, wherein the expansible seals comprise hollow portions and pressure tubing means (12) for inflating said hollow portions to urge associated solid portions of the seals to emerge from the channels.

6. An apparatus according to claim 2, wherein the first sealing means comprises a flexible ring (20) for unilaterally supporting the object in said one mold half inside the central cavity, and an opening (21) leading into the suction chamber formed by the ring and adapted to be connected to a vacuum source.

* * * * *